United States Patent [19]

Ehnholm et al.

[11] Patent Number: 5,315,250
[45] Date of Patent: May 24, 1994

[54] MAGNETIC RESONANCE IMAGING

[75] Inventors: Gosta J. Ehnholm, Helsinki, Finland; John S. Petersson, Helsingborg, Sweden

[73] Assignee: Instrumentarium Corporation, Helsinki, Finland

[21] Appl. No.: 931,770

[22] Filed: Aug. 18, 1992

Related U.S. Application Data

[63] Continuation of Ser. No. 891,296, May 29, 1992, abandoned.

[30] Foreign Application Priority Data

May 31, 1991 [GB] United Kingdom ............... 9111738

[51] Int. Cl.$^5$ .......................................... G01V 3/00
[52] U.S. Cl. .................................. 324/309; 324/316
[58] Field of Search .................... 324/307, 309, 316; 128/653.3, 653.2, 653.4

[56] References Cited

U.S. PATENT DOCUMENTS

| | | | |
|---|---|---|---|
| 4,719,425 | 1/1988 | Ettinger | 324/316 |
| 4,984,573 | 1/1991 | Leunbach | 128/653.4 |
| 5,146,924 | 9/1992 | Sepponen | 324/316 |
| 5,154,603 | 10/1992 | Sepponen | 128/653.3 |

FOREIGN PATENT DOCUMENTS

| | | |
|---|---|---|
| 0375074 | 6/1990 | European Pat. Off. |
| 9013047 | 11/1990 | PCT Int'l Appl. |
| 2225431 | 5/1990 | United Kingdom |

OTHER PUBLICATIONS

Bach Andersen, "Electromagnetic Heating" Jul. 1984, Aarhus, Denmark pp. 113–128.
G. J. Ehnholm and S. Vahasalo, "Field Applicators for Magnetic Resonance", 1991, pp. 213–216 (no month).

Primary Examiner—Louis Arana
Attorney, Agent, or Firm—Chilton, Alix & Van Kirk

[57] ABSTRACT

The invention provides method of electron spin resonance enhanced magnetic resonance imaging of a subject, for example a human, animal or inanimate body, in which said subject is exposed to radiation of a frequency selected to stimulate an esr transition in a paramagnetic species in said subject whereby to effect dynamic nuclear polarization, wherein said exposure to radiation is arranged such that within the region of said subject so exposed the capacity of said radiation to stimulate a said transition is relatively enhanced in at least one volume (a region of interest (ROI)), i.e. a method in which one or more regions-of-interest within the subject under study are selected by making it possible for an enhancement agent to act more effectively in that region than outside. The method for example also allows flow processes within a body to be monitored to provide the operator with images or data sets indicative of the spatial and/or temporal characteristics of flow from the ROI.

16 Claims, 2 Drawing Sheets

MAGNETIC RESONANCE IMAGING

CROSS REFERENCE TO RELATED APPLICATION

This application is a continuation of application Ser. No. 07/891296 filed May 29th, 1992, now abandoned.

BACKGROUND OF THE INVENTION

The present invention relates to a method of magnetic resonance imaging (MRI), in particular a method of electron spin resonance enhanced MRI, and to apparatus for the performance of such methods.

Electron spin resonance enhanced MRI, referred to herein as OMRI (Overhauser MRI) but also referred to in earlier publications as ESREMRI or PEDRI, is a form of MRI in which enhancement of the magnetic resonance signals from which the images are generated is achieved by virtue of the dynamic nuclear polarization that occurs on VHF stimulation of an ESR transition in a paramagnetic material, generally a persistent free radical, in the subject under study. Magnetic resonance signal enhancement may be by a factor of a hundred or more thus allowing OMRI images to be generated rapidly and with relatively low primary magnetic fields.

OMRI techniques have been described by several authors, notably Leunbach, Lurie, Ettinger, Grucker, Ehnholm and Sepponen, for example in EP-A-296833, EP-A-361551, WO-A-90/13047, J. Mag. Reson. 76:366–370 (1988), EP-A-302742, SMRM 9:619 (1990), SMRM 6:24 (1987), SMRM 7:1094 (1988), SMRM 8:329 (1989), U.S. Pat. No. 4719425, SMRM 8:816 (1989), Mag. Reson. Med. 14:140–147 (1990), SMRM 9:617 (1990), SMRM 9:612 (1990), SMRM 9:121 (1990), GB-A-2227095, DE-A-4042212, and GB-A-2220269.

In the basic OMRI technique, the imaging sequence involves initially irradiating a subject placed in a uniform magnetic field (the primary field $B_o$) with radiation, usually VHF radiation, of a frequency selected to excite a narrow linewidth ESR transition in a paramagnetic enhancement agent which is in or has been administered to the subject. Dynamic nuclear polarization results in an increase in the population difference between the excited and ground nuclear spin states of the imaging nuclei, i.e. those nuclei, generally protons, which are responsible for the magnetic resonance signals. Since MR signal intensity is proportional to this population difference, the subsequent stages of each imaging sequence, performed essentially as in conventional MRI techniques, result in larger amplitude FID signals being detected.

The objective of the present invention is to provide an OMRI method in which a spatial weighting is given to stimulation of the ESR transition and hence to the FID signal enhancement. In this way the special properties of the dynamic polarization event may be used to enhance the imaging procedure, e.g. to improve signal/noise properties and reveal additional information about the subject under study, especially information on dynamic behaviour such as flow and perfusion in a three dimensional object.

SUMMARY OF THE INVENTION

Thus viewed from one aspect the invention provides a method of electron spin resonance enhanced magnetic resonance imaging of a subject, for example a human, animal or inanimate body, in which said subject is exposed to radiation of a frequency selected to stimulate an esr transition in a paramagnetic species in said subject whereby to effect dynamic nuclear polarization, the improvement comprising arranging said exposure to radiation such that within the region of said subject so exposed the capacity of said radiation to stimulate a said transition is relatively enhanced in at least one volume (a region of interest (ROI)).

Thus in effect the method of the invention is one in which one or more regions-of-interest within the subject under study are selected by making it possible for an enhancement agent to act more effectively in that region than outside.

DESCRIPTION OF THE INVENTION

In the references cited above, and for example in copending U.S. patent application Ser. No. 07/790209 currently pending (U.S.) (corresponding to published British Application 2,252,244) it is explained how the resonance frequency of an ESR transition is dependant on the strength of the magnetic field. Accordingly spatial weighting of the ability of VHF radiation of a given frequency to produce dynamic nuclear polarization can easily be achieved by effecting VHF irradiation during a period when the magnetic field experienced by the subject is non-uniform. Thus, for a selected VHF frequency, by imposing a linear or non-linear magnetic field gradient the spatial location and extent of the region (the ROI) in which dynamic nuclear polarization occurs may be selected. Such a ROI selection technique is relatively straightforward since field gradient imposition means will generally be present in the MRI apparatus for use in the MR signal generation/detection phases, e.g. the slice selection, phase encoding and read phases, of the imaging sequence.

However spatial weighting may also be effected by focussing the magnetic component of the VHF field. Techniques for focussing the electric component of the field have been developed in the field of hypothermia treatment apparatus and the magnetic component can be focussed analogously. (See for example "Electromagnetic Heating" by J. Bach Andersen in Proceedings of the 4th International Symposium on Hypothermia Oncology, July 1984, Aarhus, Denmark and Gösta Ehnholm and S. Vahasalo "Field applications for magnetic resonance", Book Heiliö, Kluwer Academic Publishers, 1991). The field focussing technique of ROI selection according to the method of the invention has an associated advantage in that energy absorption by the subject under study is decreased outside the selected ROI.

In order to effect to enhance dynamic nuclear polarization within the ROI the focussing should be such as to make the magnetic component of the VHF field that is perpendicular to the primary magnetic field $B_o$ larger within the ROI than outside.

If desired VHF focussing and magnetic field gradient imposition may be used together in order to effect ROI selection according to the method of the invention.

Field gradient imposition may if desired by coupled with the use of two or more VHF frequencies thus defining a plurality of ROI's within the subject.

The ROI can thus be selected effectively at will. If a paramagnetic species with a single ESR line is used as the enhancement agent the situation will be especially simple. Application of a linear gradient together with a single VHF frequency during the polarization event will give a ROI which has the shape of a slice perpendicular to the direction of the gradient. Focussing can be used to define part of the slice and/or to decrease heating outside the ROI. Focussing has been found to be an effective way of defining small ROI's, e.g. of the order of 2-20 cm, especially 3-15 cm, particularly 5-10 cm diameter. Thus for example using a 280 MHz VHF frequency, focussing has been demonstrated to be able to produce a focal spot of about half wavelength (about 5 cm) size.

Using an enhancement agent with several ESR lines close to each other, and again applying a linear gradient and single frequency, the field gradient imposition will result in a plurality of ROI's; a set of slices, one for each ESR line. This has been demonstrated for a persistent free radical having six ESR lines spaced apart somewhat more than the width of the lines (about 30 milliGauss in field units). Applying a gradient of 100 milliGauss clearly defined a set of slices and spacing about twice the slice thickness.

The dynamic polarization in a selected ROI, hereinafter Selective Dynamic Polarization (SDP), can be combined with selective proton (or other nuclei) excitation (SPE) when forming the OMRI image. Different methods for SPE, for instance selective slice selection, are well known in the art of MRI. By choosing different ROI's for the SDP and SPE it is possible to follow dynamic processes in which material from within the SDP ROI passes into the SPE ROI, e.g. fluid flows such as that of blood or other liquids. As mentioned above, the FID signal intensity enhancement in OMRI may be by a factor or a hundred or more and thus the OMRI images will be dominated by the signal from the protons which have migrated from the SDP ROI to the SPE ROI during the period between the dynamic polarization event and the NMR stimulation event.

Thus for example SDP may be effected to generate a series of parallel slice shaped ROI's separated by effectively unpolarized slices. This can be done by applying the VHF pulses in the presence of a linear gradient. If the enhancement agent has a single ESR line then one VHF pulse for each slice would be applied simultaneously. If the enhancement agent has several ESR lines a single VHF frequency might suffice. Both methods can also be combined.

The imaging sequence used in conjunction with the SDP can be for instance a multislice method with image generating slices positioned in the unpolarized regions between the dynamically polarized slices formed by the SDP. The images will then show signals in regions where protons have been transported from the SPD ROI to the SPE slices, e.g. by flow. The image or images will thus show the flow patterns.

The SDP ROI can be varied, depending on the type of motion or flow one wants to detect. One can, for instance, choose the SDP ROI to coincide with the blood inside the heart and subsequently make a set of images of the vessels containing the outflowing blood with each image corresponding to a different elapsed time after the polarizing VHF pulse which is triggered by the cardiac cycle. This is accomplished by generating a train of echoes after each VHF pulse, using for instance a RARE or echo planar sequence. As is well known in the art, RARE is an acronym for "Rapid Acquisition with Relaxation Enhancement". RARE imaging is described in detail, by way of example, in the text MAGNETIC RESONANCE IN MEDICINE, in an article by J. Henning et al entitled "RARE Imaging: A Fast Imaging Method for Clinical MR", published in 1986 by Academic Press, Inc., pages 823-833 and in the text MAGNETIC RESONANCE IMAGING, Vol. 6, pages 391-395, published in 1988 by Pergamon Press in an article by J. Henning et al entitled "Clinical Applications and Methodolical Developments of the RARE Technique". Each echo is frequency coded in the standard way and in addition phase coded, with a phase encoding gradient pulse applied just before it. After the echo, phase encoding is rewound with a similar gradient pulse of opposite sign. Similar phase encoding and rewinding is applied for each echo in the train, the echoes will then differ only to the extent that the object being imaged has changed during the time between echoes.

By making the VHF pulse and the subsequent proton NMR echo trains many times, for example 128, one can obtain signal information that can be formed into a sequence of MRI images, one corresponding to the first echo in the trains, a next to the second echo and so on. The result is a cine film showing the flow of blood during the cardiac cycle. The advantage compared to non-OMRI methods is that the proton signal from the background that is outside the SDP ROI can be effectively negligible.

The ability to define a SDP ROI is also advantageous where one wishes to image a region in which the enhancement agent concentration is lower than in a neighbouring region. Thus by suitable definition of the ROI, comparatively weak signals can be detected and seen more clearly in the resulting image because the previously image-dominating signals from the neighbouring regions have been suppressed.

Thus viewed from a further aspect the invention provides a method of monitoring a flow process in a body by OMRI, said method comprising effecting the dynamic nuclear polarization phase of the OMRI imaging sequence in one or more regions of interest within said body and generating from the detected FID signals one or more images or data sets indicative of the spatial and/or temporal characteristics of flow from said region of interest. Generally, although not always, the method of monitoring will involve generation of an image or image sequence, such as are described above, which shows flow patterns or rates; however the method may be of value even where no image is generated. Thus the MR signal intensity from specific target volumes may be monitored, e.g. to show that flow variations are occurring, to show that flow from the SDP ROI to the target volume is occurring, to show flow rates between target volumes or between the SDP ROI and a target volume, etc.

To perform the methods of the invention OMRI apparatus may be adapted to allow for SDP ROI selection, e.g. by provision of means for VHF focussing or by provision of field gradient imposition means or adaptation of the control means to permit existing gradient coils to be used to impose gradients during the dynamic polarization stage of the imaging sequence.

Thus viewed from a still further aspect the invention provides OMRI apparatus having means arranged in practice to cause the capacity of the dynamic polarization inducing radiation to induce dynamic polarization to be greater in one or more selected regions of interest, e.g. within the field of view of the apparatus.

The MRI imaging sequence used in the methods and apparatus of the invention may be any conventional sequence; however the technique is particularly suited to the fast imaging techniques such as the EPI techniques for example. The spin-warp techniques mentioned in the OMRI references above can nonetheless be used. However it has been found that the MRI sequence called RARE, which adapted for OMRI is here termed OMRI-RARE, is especially suited for a large variety of OMRI imaging procedures as it has the particular advantage that it can be tailored to give optimal s/n ratio for both fast and slow pulse sequences.

Thus viewed from a yet still further aspect the invention provides a method of OMRI characterized in that as the imaging sequence is used OMRI-RARE.

By OMRI-RARE is thus meant an imaging sequence which comprises a dynamic polarization phase and spin-echo train generation using a train of phase encoding gradients of changing magnitude.

BRIEF DESCRIPTION OF THE DRAWINGS

An example of the OMNI-RARE sequence, usable in the methods of the invention, will now be described further with reference to the accompanying figures in which.

DETAILED DESCRIPTION

Figure 1:
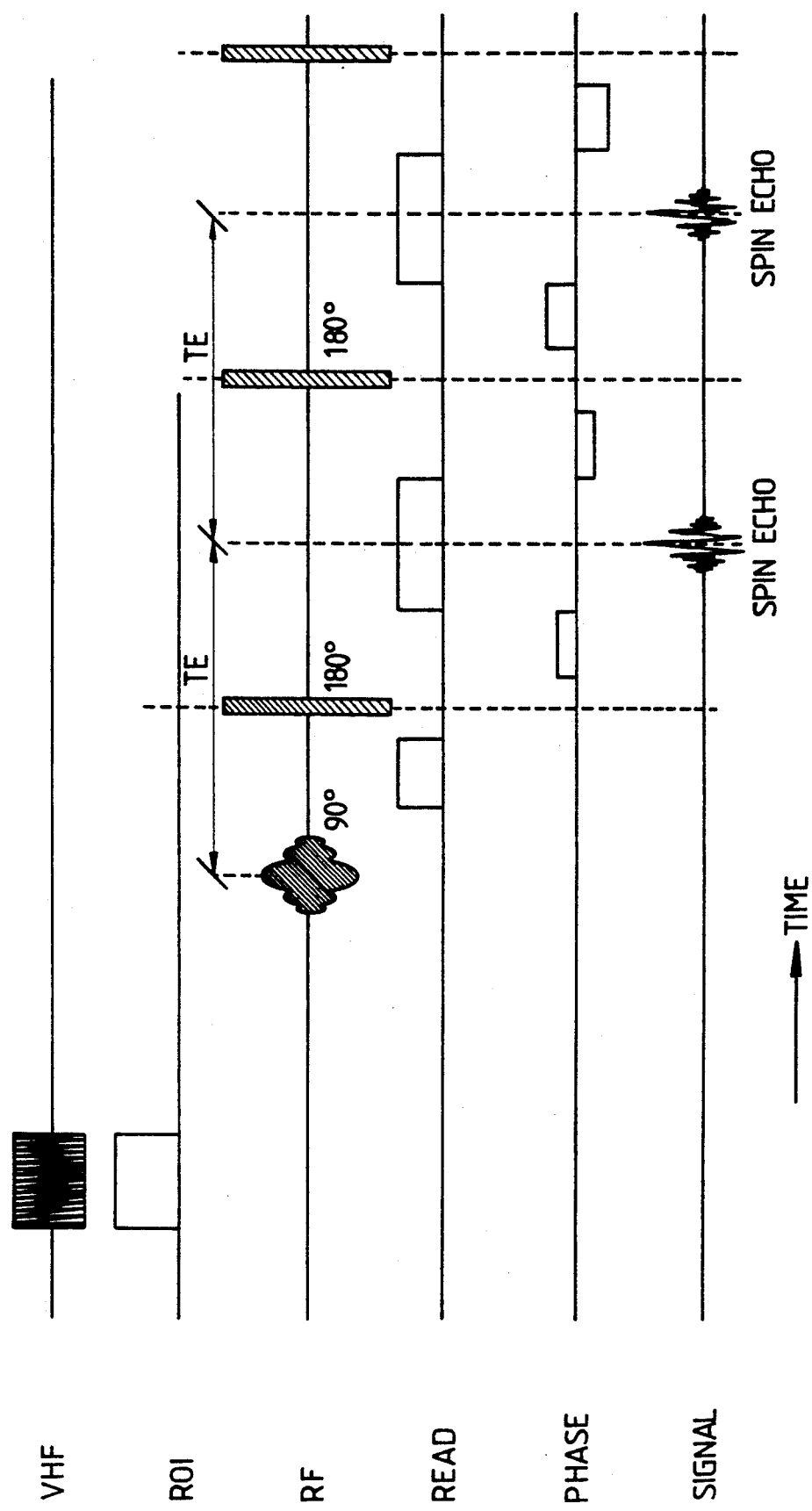
FIG. 1 is a schematic representation of the sequence timing.

Referring to FIG. 1, for a ROI-selection OMRI procedure, the VHF dynamic polarization pulse (VHF) is applied during the period that the one or more field gradients (ROI) which serve to define the SDP ROI's are applied.

The VHF radiation can be at one or several frequencies which can be applied simultaneously or in sequence during the indicated interval. The duration of the VHF pulse should usually be equal to a typical value of the spin-lattice relaxation time $T_1$ in the parts of the sample that give proton signal to the image; this is optimal for s/n. After the VHF pulse, usually as soon as possible to save time, a 90° RF pulse for exciting the protons (or other used nuclear spins) is applied. During this RF excitation period a slice selection gradient can if desired be applied. Alternatively if desired the slice selection gradient may be omitted so that the NMR excitation occurs in the sample as a whole. After this pulse a series of spin echoes is formed using 180° RF pulses in the conventional manner. The echoes are frequency coded with a corresponding gradient ("Read" in the Figure) and phase encoded with another gradient ("Phase"), preferably perpendicular to the "Read" gradient. The phase encoding can be rewound after each echo as indicated, this is usually advantageous, if a flow is being imaged.

This sequence has been used in an imager where TE, the time between echoes could be as small as 14 ms. In a typical case 300 ms VHF pulses were applied with 26 echoes in 364 ms. A total of five VHF pulses were applied to obtain altogether 128 echoes. Each echo was phase encoded with a unique gradient. The data could be combined and Fourier transformed in the conventional way to form an image. The total imaging time was 3.5 sec with 1.5 sec of VHF irradiation. This allowed the following advantages to be obtained: first, the VHF pulse length could be chosen as approximately equal to $T_1$, for the protons to have time to obtain a reasonably high level of polarization. Second the duration of the echo train following each VHF pulse could be made of the order of $T_2$, the proton spin-spin relaxation time, in order to utilize the obtained magnetization optimally. Third, the sequence was fast because many spin echoes, each with a different phase encoding, could be made for each VHF pulse. Fourth, the sequence is flow compensated in the phase encoding direction due to the phase rewinding (the time integral of the phase encoding gradient averages to zero over each TE). Fifth, the read direction could easily also be flow compensated by adding negative gradient pulses on each side of the indicated positive ones to make the time average over TE equal to zero for this gradient too.

By varying the number of VHF pulses per image on one hand, and of echoes in the train on the other, a large variety of timing parameters can be realized to accommodate many different situations in an optimal way.

In conventional MRI, at high fields the RARE sequence has problems with RF heating because of the great number of 180° pulses which are used. For OMRI-RARE however the problem does not arise as OMRI permits much lower primary magnetic fields to be used and as a result the RF frequency, and its heating effect, are normally quite low.

Compared to the echo-planar sequence, which uses gradient echoes instead of spin echoes, but is otherwise fairly similar, the RARE sequence is less demanding on gradient strength. The echo-planar sequence, however, can also be combined with OMRI to give many of the indicated advantages.

Figure 2:
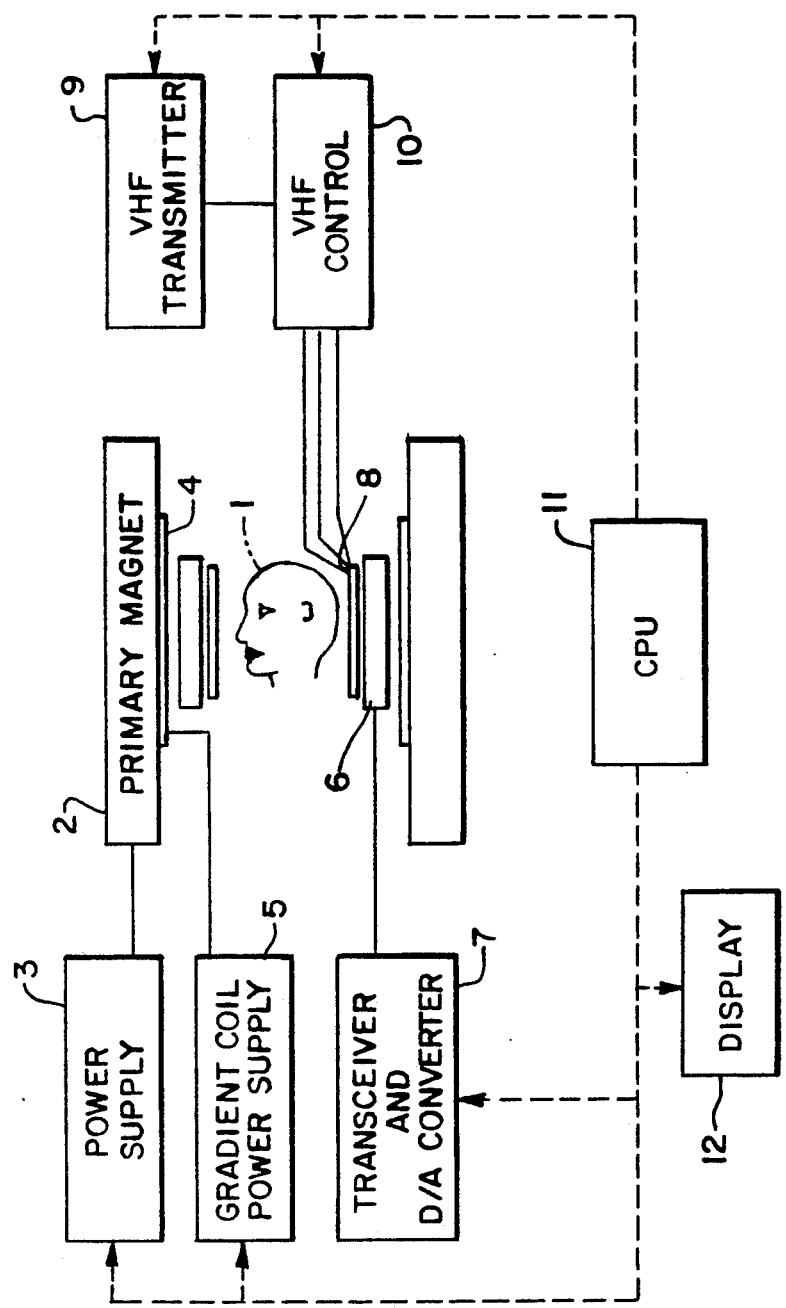
FIG. 2 is a schematic representation of the imaging apparatus.

Referring to FIG. 2 there is shown an OMRI apparatus arranged to perform the method of the invention.

The subject 1 being imaged is disposed within primary magnet 2 which is powered by power supply 3, magnetic field gradients are imposed by gradient coils 4 which are powered by power supply 5.

Disposed about subject 1 are transceiver coils 6 for the magnetic resonance (RF) radiation controlled by RF transceiver and digital/analogue transformer 7. Also disposed about subject 1 are the emitter coils 8 for the electron spin resonance inducing (VHF) radiation. VHF coils 8 are supplied by the VHF transmitter 9 and controlled by VHF control means 10 which operates to focus the radiation used for dynamic polarization, e.g. by feeding signals with adjustable phase and amplitude to a set of different inputs in the VHF coil.

Power supplies 3, 5, controller 10 and transmitter/receiver units 7, 9 are controlled by a central processor unit 11 which performs signal manipulation and displays the resultant images on display unit 12.

Documents referred to above are incorporated herein by reference.

We claim:

1. In a method of electron spin resonance enhanced magnetic resonance imaging wherein a subject is exposed to radiation of a frequency selected to stimulate an esr transition in a paramagnetic species in the subject to thereby effect dynamic nuclear polarization, the improvement comprising arranging said exposure to radiation such that within the region of the subject exposed to the esr stimulating radiation the capacity of said radiation to stimulate a said esr transition is relatively enhanced in at least one volume relative to the rest of the region of the subject so exposed whereby the esr stimulation within the said one volume is greater than elsewhere in the region exposed and the magnetic resonance signal enhancement for nuclei within that volume at the time of esr stimulation is also enhanced relative to the signal coming from other nuclei within the subject.

2. A method as claimed in claim 1 wherein said subject is a human or animal body.

3. A method as claimed in claim 1 wherein the relative enhancement of the capacity of said radiation to stimulate a said transition is effected by imposition on said subject of a magnetic field gradient during the exposure of said body to said radiation.

4. A method as claimed in claim 1 wherein the relative enhancement of the capacity of said radiation to stimulate a said transition is effected by focussing the magnetic component of the electromagnetic field of said radiation.

5. A method as claimed in claim 4 wherein said focussing is so effected as to cause the magnetic component of said electromagnetic field that is perpendicular to the primary magnetic field imposed on said subject during the magnetic resonance imaging thereof to be relatively enhanced within said volume.

6. A method as claimed in claim 2 wherein there is administered to said body a physiologically tolerable paramagnetic species.

7. A method as claimed in claim 6 wherein said paramagnetic species has a plurality of lines in its esr spectrum.

8. A method as claimed in claim 1 wherein said capacity of said radiation to stimulate a said transition is simultaneously relatively enhanced in a plurality of said volumes.

9. A method as claimed in claim 1 wherein selective proton excitation is effected in the generation of the magnetic resonance image of said subject.

10. A method as claimed in claim 9 for the study of dynamic processes occurring in said subject.

11. A method as claimed in claim 10 for the study of blood flow.

12. A method as claimed in claim 1 wherein said volume is selected to contain blood within the heart of a human or animal subject, wherein the magnetic imaging sequence used is one generating a train of detectable echoes, wherein the imaging sequence is repeated and wherein the detected echoes from the repeated imaging sequences are used to generate a series of images indicative of the temporal and spatial development of blood flow from the heart.

13. A method as claimed in claim 12 wherein said imaging sequence is an echo planar imaging or RARE sequence.

14. A method of monitoring a flow process in a body by OMRI, said method comprising the steps of effecting the phase of the OMRI imaging sequence in which the body is exposed to electron spin resonance transition stimulating radiation in at least a first region of interest within the body which is subjected to OMRI, detecting free induction decay signals from said first region and generating one or more images or data sets indicative of the spatial and/or temporal characteristics of flow from said first region from said detected signals.

15. In a method of imaging by electron spin resonance enhanced magnetic resonance imaging the improvement comprising employing an RARE sequence as the imaging sequence.

16. In magnetic resonance imaging apparatus wherein a subject is exposed to electron spin resonance transition stimulating radiation, the improvement comprising means for causing the phase in which the subject is exposed to the electron spin resonance transition stimulating radiation, to thereby induce dynamic polarization in the subject, to be greater in one or more selected regions of interest within the subject than within other adjacent regions.

* * * * *